United States Patent

Fogal et al.

[11] Patent Number: 5,322,207
[45] Date of Patent: Jun. 21, 1994

[54] METHOD AND APPARATUS FOR WIRE BONDING SEMICONDUCTOR DICE TO A LEADFRAME

[75] Inventors: Rich Fogal; Chender Huang; Mike Ball, all of Boise, Id.

[73] Assignee: Micron Semiconductor Inc., Boise, Id.

[21] Appl. No.: 56,656

[22] Filed: May 3, 1993

[51] Int. Cl.⁵ .................................. H01L 21/60
[52] U.S. Cl. ........................... 228/180.5; 228/4.5
[58] Field of Search ............ 228/179, 4.5, 6.2, 47.1; 269/903, 87.3, 40, 43

[56] References Cited

U.S. PATENT DOCUMENTS

| | | | |
|---|---|---|---|
| 2,743,693 | 5/1956 | Schaper | 269/40 |
| 3,680,193 | 8/1972 | Scaminaci, Jr. et al. | 269/40 |
| 3,894,671 | 7/1975 | Kulicke, Jr. et al. | 228/4.5 |
| 4,441,205 | 4/1984 | Berkin et al. | 382/8 |
| 4,871,106 | 10/1989 | Wharff | 269/40 |
| 4,877,173 | 10/1989 | Fujimoto et al. | 228/1.1 |
| 4,886,200 | 12/1989 | Tsumura | 228/1.1 |
| 4,899,207 | 2/1990 | Hallowell et al. | 357/70 |
| 4,951,120 | 8/1990 | Hagiware et al. | 357/70 |
| 4,979,663 | 12/1990 | Sofia et al. | 228/180.2 |
| 5,082,165 | 1/1992 | Ishizuka | 228/179 |
| 5,111,989 | 5/1992 | Holdgrafer et al. | 228/110 |
| 5,116,031 | 5/1992 | Takeuchi et al. | 269/87.3 |
| 5,119,436 | 6/1992 | Holdgrafer | 382/8 |
| 5,137,201 | 8/1992 | Yamazaki et al. | 228/103 |
| 5,176,311 | 1/1993 | Levine et al. | 228/179 |
| 5,238,174 | 8/1993 | Ricketson et al. | 228/180.21 |

Primary Examiner—Samuel M. Heinrich
Attorney, Agent, or Firm—Stephen A. Gratton

[57] ABSTRACT

A method and apparatus for wire bonding bond pads formed on semiconductor dice to the lead fingers of a semiconductor leadframe are provided. Using an automated wire bonding apparatus two (or more) adjacent dice attached to the leadframe are wire bonded using a single indexing step for the leadframe. The wire bonding apparatus includes a heat block for heating the two adjacent dice, and a clamp for clamping the two adjacent dice to the heat block for wire bonding. A bonding tool of the wire bonding apparatus is moved to successively wire bond the two adjacent dice. The method of the invention is suitable for DIP, ZIP, SOJ, TSOP, PLCC, SOIC, PQFP, or IDF semiconductor packages.

15 Claims, 3 Drawing Sheets

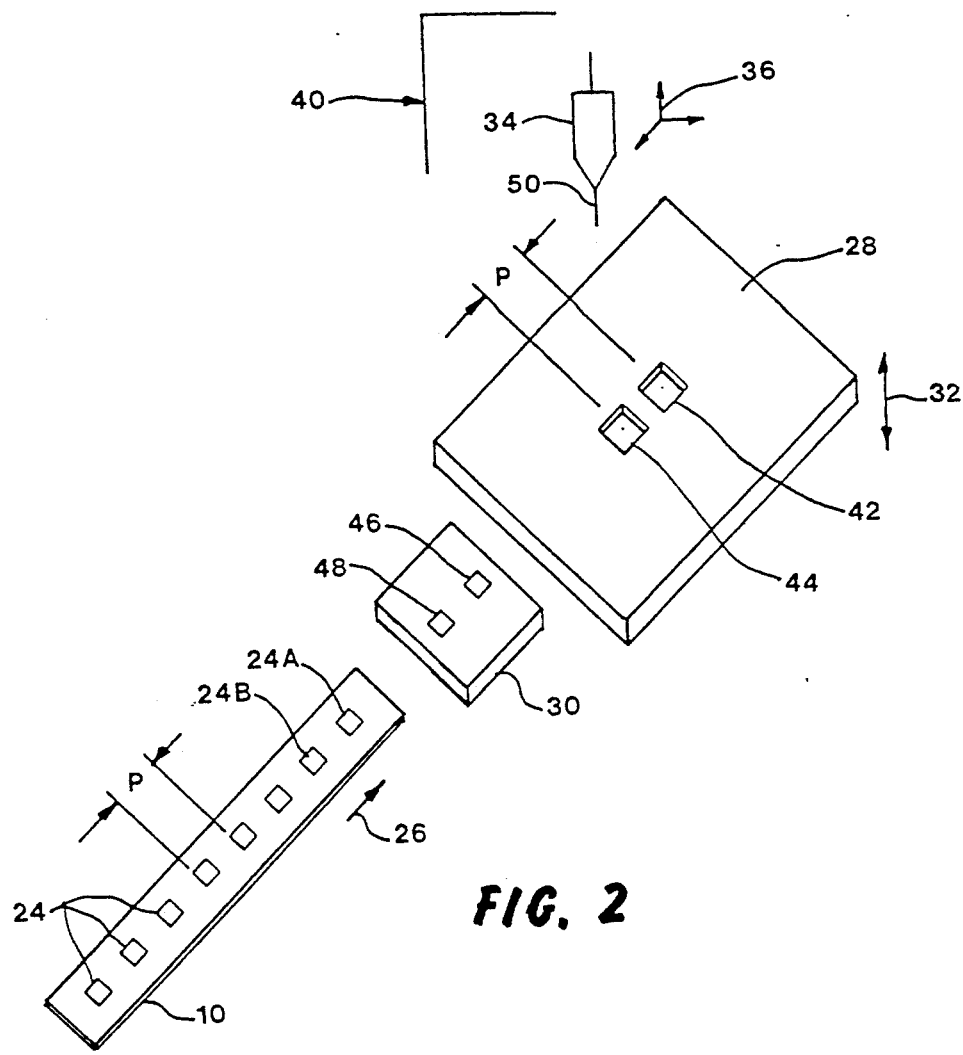
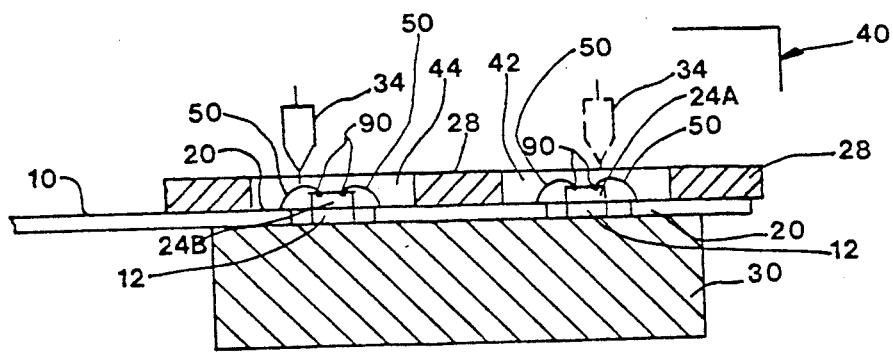
FIG. 2
FIG. 3

METHOD AND APPARATUS FOR WIRE BONDING SEMICONDUCTOR DICE TO A LEADFRAME

FIELD OF THE INVENTION

This invention relates to semiconductor manufacture and more particularly to a novel method and apparatus for simultaneously wire bonding two or more semiconductor dice to a leadframe using a single indexing step.

BACKGROUND OF THE INVENTION

In semiconductor manufacture, a single semiconductor die is typically mounted within a sealed package. Semiconductor packages (or chips) come in a variety of different designs. Among the different package designs are dual inline packages DIP, zig-zag inline packages ZIP, small outline J-bends SOJ, thin small outline packages TSOP, plastic leaded chip carriers PLCC, small outline integrated circuit SOIC, plastic quad flat pack PQFP, and interdigitated leadframe IDF.

In general, all package designs incorporate several common elements. These common elements include a sealed package enclosure, a die-attachment area, bonding wires for making electrical contact between the bond pads on the die and the leads of the package, and the inner and outer lead fingers of the metal lead system for the package.

Typically, the initial component in the packaging process is a leadframe or leadframe strip. A leadframe strip is a metal frame which is several inches long. The leadframe strip supports each semiconductor die for packaging and provides the leads for the final semiconductor package. A typical leadframe strip is produced from metal sheet stock (e.g. a copper alloy) and is adapted to mount several (e.g. eight) semiconductor packages. During the manufacturing process each leadframe strip is moved and indexed through the various manufacturing stages as a unit.

In a conventional semiconductor packaging process, the dice are initially attached to mounting paddles of a leadframe strip. During a wire bonding process, the bond pads formed on the face of each die are connected to the lead fingers of the leadframe strip using fine bond wires. The semiconductor dice are then encapsulated and a trim and form operation is used to separate the resultant interconnected packages and to bend the leads of each semiconductor package into the proper configuration.

The present invention is directed to the wire bonding process. Apparatus for wire bonding semiconductor dice are well known in the art. U.S. Pat. No. 3,894,671 to Kulicke Jr. et al, U.S. Pat. No. 4,877,173 to Fujimoro et al, and U.S. Pat. No. 5,082,165 to Ishizuka, disclose representative wire bonding apparatus. Earlier versions of wire bonding apparatus were manually operated by an operator viewing the semiconductor die through a microscope. More recently, automated wire bonding apparatus include vision systems for automatically sensing the locations of the bond pads on the dice and lead fingers of the leadframe to perform the wire bonding process.

During the wire bonding process a single die attached to a leadframe is held between a wire bonding clamp and a wire bonding heat block of the wire bonding apparatus. The heat block heats the semiconductor die and the leadframe to a temperature of about 150° C. to 350° C. A bonding tool then mechanically presses a fine bond wire to a bond pad of the die and then to a bonding site on an appropriate lead finger.

The bond wire is typically a fine gold or copper wire that is threaded through the bonding tool. The end of the wire is heated by an electrical discharge or a hydrogen torch to a molten state. This forms a ball of molten metal on the end of the bond wire. For bonding a selected bond pad of the heated die, the molten ball is pressed by the bonding tool against the bond pad. This mechanically bonds the bond pad and bond wire to one another. The bonding tool is then moved over a bonding site on the lead finger and the heated bond wire is pressed against the bond site. This mechanically bonds the bond wire and the lead finger to one another. The bond wire is then tensioned and sheared. This process is repeated for each bond pad on the die.

A critical step of the wire bonding operation is the initial indexing of a leadframe strip. Prior to the wire bonding step, an indexing assembly of the wire bond apparatus precisely moves the leadframe strips to place the dice one at a time between the wire bonding clamp and the wire bonding heat block. This indexing step must be performed for each die on a leadframe. Misplacement of the leadfree or die during the wire bonding process may cause the wire bond apparatus to jam and the wire bonds to be misplaced. Moreover, an indexing step for each die on a leadframe is relatively time consuming and adds to the complexity of the wire bonding process. The present invention recognizes that the wire bonding process can be simplified and improved if two or more dice are wire bonded with a single index of a leadframe strip. At the same time, the speed and throughput of the wire bonding process can be improved.

Accordingly it is an object of the present invention to provide a method and apparatus for wire bonding bond pads on semiconductor dice to the leadfingers of a semiconductor leadframe. It is a further object of the present invention to provide a method and apparatus for wire bonding multiple semiconductor dice on a leadframe with a single indexing strip of the leadframe. It is yet another object of the present invention to provide a method and apparatus for wire bonding bond pads on a semiconductor die to the lead fingers of a leadframe that is fast, efficient and adaptable to large scale semiconductor manufacture.

SUMMARY OF THE INVENTION

In accordance with the present invention a novel method and apparatus for bonding the bond pads on a semiconductor die to the lead fingers of a leadframe are provided. The method of the invention, broadly stated, comprises the wire bonding of two or more semiconductor dice with a single indexing step of a wire bonding apparatus.

In an illustrative embodiment of the invention, two semiconductor dice are wire bonded with a single index of the wire bond apparatus. For wire bonding two semiconductor dice, the wire bonding apparatus of the invention includes a clamp for clamping two adjacent dice on a leadframe against a heat block. The clamp is formed with two bond site windows. A bonding tool is adapted to operate through these bond site windows for successively wire bonding the bonding pads on each die to the appropriate lead fingers of the leadframe. The spacing of the bond site windows corresponds to the spacing of the dice on the leadframe (i.e. pitch of the leadframe). The heat block is also constructed to accommodate two dice and includes contact areas for two dice. In addition, the heat block includes two vacuum ports for simultaneously placing two dice in contact with the contact areas of the heat block.

These and other objects, features and advantages of the invention will be apparent from the following more particular description of the preferred embodiments of the invention as illustrated in the accompanying drawings.

BRIEF DESCRIPTION OF THE DRAWINGS

FIG. 2 is a schematic perspective view showing components of a wire bond apparatus constructed in accordance with the invention;

FIG. 3 is a schematic cross sectional view illustrating a wire bonding process in accordance with the method of the invention;

DETAILED DESCRIPTION OF THE PREFERRED EMBODIMENTS

Figure 1:
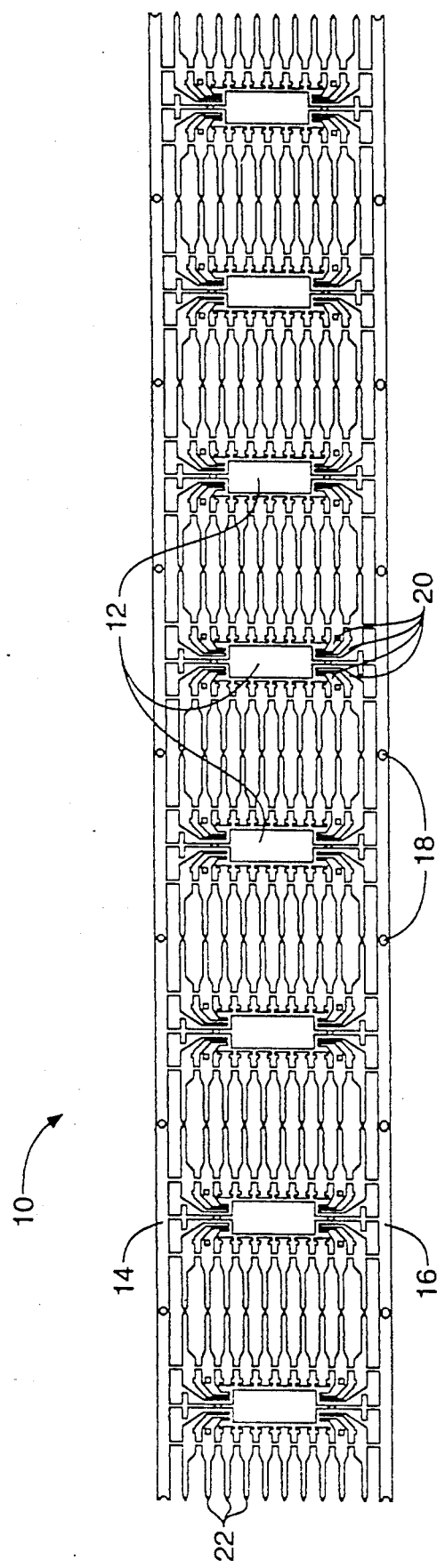
FIG. 1 is a plan view of a prior art semiconductor leadframe strip.

A typical leadframe strip 10 used in semiconductor manufacture is depicted in FIG. 1. The leadframe strip 10 is adapted to mount several semiconductor dice (i.e. eight dice) for packaging. The leadframe strip 10 includes die mounting paddles 12 for mounting the individual semiconductor dice. In addition, the leadframe strip 10 includes parallel spaced strip rails 14, 16 formed with a pattern of openings 18 for handling by automated machinery. The leadframe strip 10 also includes an arrangement of lead fingers 20 adapted for attachment to the bond pads of a die during the wire bonding process. A terminal end 22 of the lead fingers 20 will become the external leads of a completed semiconductor package. From the point in the manufacturing process in which the die mounting paddles 12 are coated with adhesive for die bonding, until the point in which the individual semiconductor packages or chips are separated from the leadframe strip rails 14, 16 during a trim and form process, a leadframe strip 10 is treated as a unit in the manufacturing process.

Referring now to FIG. 2, the leadframe strip 10 and components of a wire bonding apparatus 40 are shown during a wire bonding process. Multiple semiconductor dice 24 have been attached to the die mounting paddles 12 (FIG. 1) of the leadframe strip 10 prior to the wire bonding process. Two adjacent semiconductor dice 24A and 24B are located at one end of the leadframe strip 10.

The wire bonding apparatus 40 may be a commercially available automatic wire bonder which has been modified in accordance with the invention. Suitable automated wire bonders are manufactured by Kulicke and Soffa Industries, Shinkawa, Kiajo Denki, and ESEC. As an example, a suitable automatic wire bonder apparatus 40 is manufactured by Kulicke and Soffa and is designated as a Model 1484 wire bonder. In accordance with the invention, such a wire bonding apparatus 40 may be modified to wire bond two semiconductor dice 24 with a single indexing step.

The wire bonding apparatus 40 includes an indexing assembly (not shown) which is adapted to move a leadframe strip 10 through the wire bonding apparatus 40, as indicated by directional arrow 26. The indexing assembly is also adapted to place a selected die 24 on the leadframe 10 at a precise location within the wire bonding apparatus 40 for wire bonding. In addition, the wire bonding apparatus 40 includes a wire bonding clamp 28 and a wire bonding heat block 30. The clamp 28 is mounted for reciprocal movement as indicated by directional arrow 32. The wire bonding apparatus 40 also includes a wire bonding tool 34 which is mounted for movement in any direction as indicated by xyz axis 36. A bond wire 50 is threaded through the bonding tool 34.

A wire bonding process is illustrated in FIG. 3. In accordance with the invention, wire bonding is performed simultaneously on two adjacent semiconductor dice contained on the leadframe 10 such as dice 24A and 24B. At the beginning of a cycle of operation, the indexing assembly moves or indexes a leadframe strip 10 to place two semiconductor dice 24A and 24B into a position within the wire bonding apparatus 40 for wire bonding. The clamp 28 then clamps both dice 24A and 24B against the heat block 30 in contact with the heat block 30.

The clamp 28 includes two bond site windows 42, 44 (FIG. 2) that allow the bonding tool 34 to access bond pads (not shown) on the semiconductor dice 24A and 24B and the lead fingers 20 of the leadframe 10. Likewise, the heat block 30 includes two paddle contact areas 46, 48 adapted to exert a vacuum force on the dice 24A and 24B and to hold the dice in contact with the heat block 30.

The heat block 30 is coupled to an external heat source. The heat block 30 functions to heat the leadframe strip 10 and the semiconductor dice 24A and 24B to an elevated temperature (e.g. 150° C.–350° C.) to facilitate wire bonding.

During a cycle of operation the bonding tool 34 moves from right to left in FIG. 3 to wire bond die 24A first and die 24B second. FIG. 3 illustrates the process at the completion of a cycle in which both dice 24A and 24B have been wire bonded.

A cycle of operation begins with a bond pad on die 24A. To begin a cycle of operation, a bond wire 50 having a molten ball 90 at one end as previously described, is pressed by the bonding tool 34 against an appropriate first bond pad of the first semiconductor die 24A. The bonding tool 34 is then moved to contact an appropriate lead finger 20 of the leadframe 10 and bond the bond wire 50 to the lead finger 50. Following attachment of the bond wire 50 to the lead finger 20, the bonding tool 34 severs the bond wire 50. Another molten ball is then formed on the severed end of the bond wire 50 and the process is repeated for each bond pad on the first semiconductor die 24A.

Once the first semiconductor die 24A is completely wire bonded, the bonding tool 34 is moved to the left and over the second die 24B. The same process is then repeated for wire bonding the second die 24B. Following wire bonding of the second die 24A, the bond tool 34 is moved back to its initial position (i.e. to the right). At the same time, the leadframe strip 10 is indexed to position the next two adjacent semiconductor dice 24 for clamping by the clamp 28 against the heat block 30 and the wire bonding process is repeated. For each adjacent pair of dice 24, the bond tool 34 will initially wire bond the die 24 furthest to the right.

The wire bond apparatus 40 may be programmed to operate with an automatic teaching process for precisely locating the bonding tool 34. A variety of such automatic teaching processes are well known in the art and are included in the automated wire bonding apparatus manufactured by the previously identified manufacturers. Such automatic teaching processes my include an image processing system for finding the exact position of the bond pads on the semiconductor dice 24A, 24B with respect to the lead fingers 20 on the leadframe 10, and moving the wire bonding tool 34 accordingly.

Figure 4:
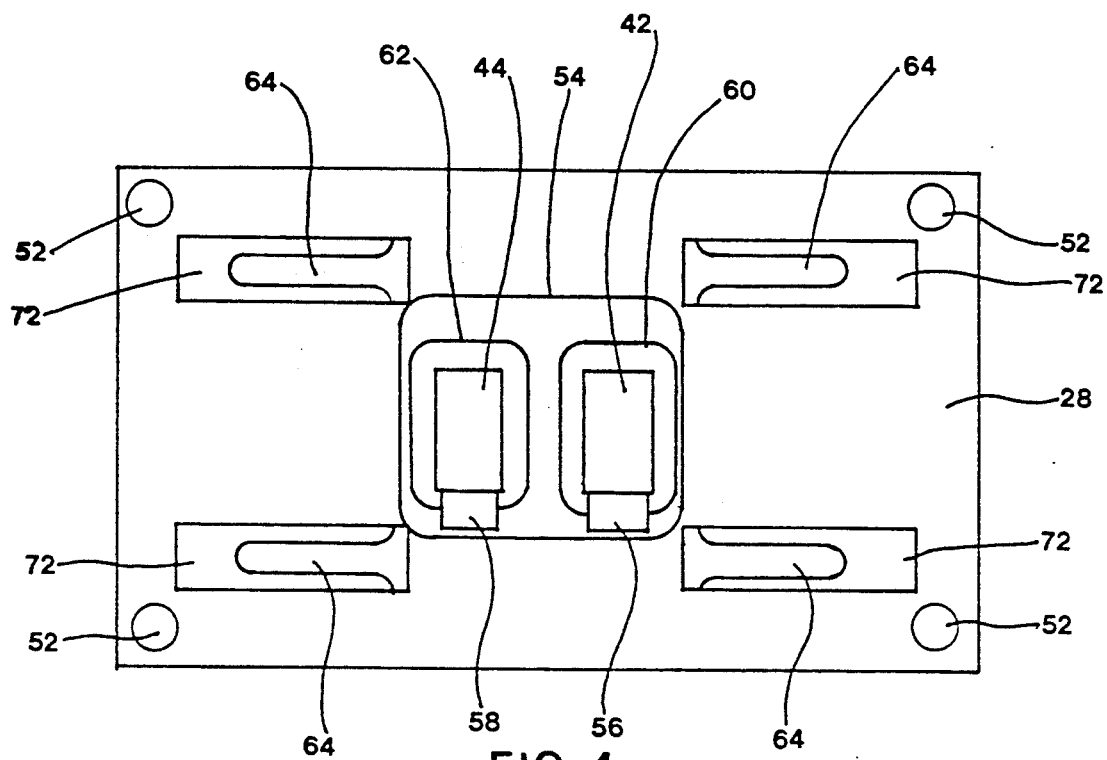
FIG. 4 is a plan view of a clamp component for a wire bonding apparatus constructed in accordance with the invention.
Figure 5:
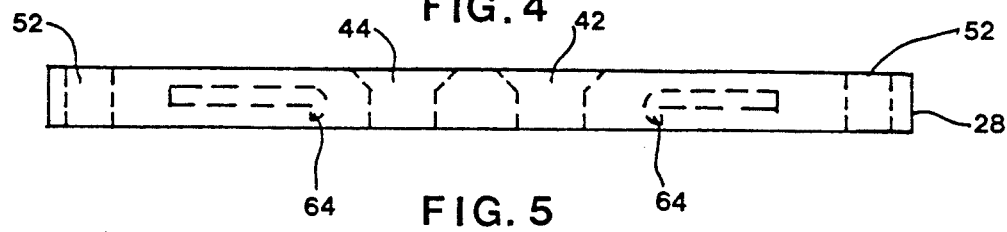
FIG. 5 is a side elevation view of FIG. 4.

Referring now to FIGS. 4 and 5, the clamp 28 of the wire bonding apparatus 40 is shown in detail. The clamp 28 is generally rectangular in shape and includes four mounting holes 52 at the four corners. The mounting holes 52 are suitable for attaching the clamp 28 to matching holes on a mounting component (not shown) of the wire bonding apparatus 40 using threaded fasteners.

The clamp 28 also includes the two bond site windows 42, 44 formed completely through the clamp 28. The bond site windows 42, 44 are generally rectangular in shape and are spaced apart to match the spacing of the mounting paddles 12 (FIG. 1) for the semiconductor dice 24 (FIG. 2). The bond site windows 42, 44 thus correspond to the pitch of the leadframe 10. This is the dimension "P" shown in FIG. 2.

The bond site windows 42, 44 are surrounded by recesses 60, 62, substantially as shown in FIG. 4. In addition, a generally rectangular shaped relief 54 or recess is formed around the two bond site windows 42, 44. Furthermore, generally rectangular shaped clearances 56, 58 are located at an end of each bond site window 42, 44.

The bond site windows 42, 44 are sized to allow access for the wire bonding tool 50 to the bond pads of the dice 24 and to the lead fingers 20 of the leadframe 10. In FIG. 3, bond site window 42 allows the bonding tool 34 to access semiconductor die 24A. Bond site window 44 allows the bonding tool 34 to access semiconductor die 24B.

The wire bonding clamp 28 also includes four leaf spring members 64. The leaf spring members 64 are pivotally mounted in recessed areas 72 on the top surface 80 of the wire bonding clamp 28. The leaf springs 64 function to contact the leadframe 10 and push the leadframe 10 away from the clamp 28 upon separation of the clamp 28 and the heat block 30.

Figure 6:
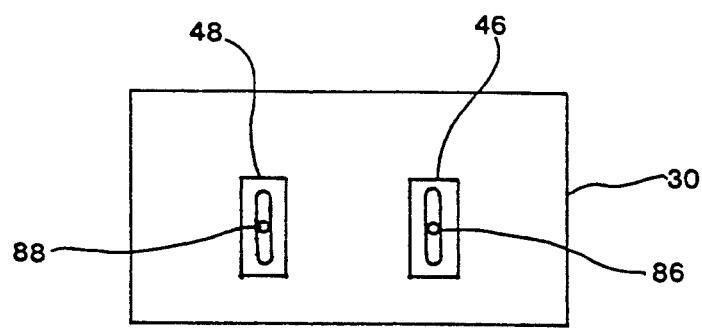
FIG. 6 is a plan view of a heat block component for a wire bonding apparatus constructed in accordance with the invention.
Figure 7:
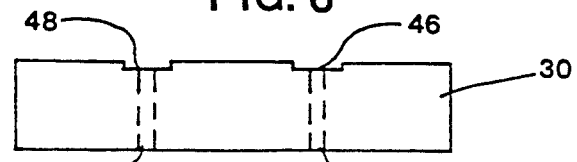
FIG. 7 is a side elevation view of FIG. 6.

Referring now to FIGS. 6 and 7, the heat block 30 is shown in detail. The heat block 30 is generally rectangular in shape and is adapted to be heated by an external heat source such as an induction heating coil. The heated heat block 30 in turn heats the semiconductor dice 24 which are clamped by the clamp 28 against the heat block 30. The heat block 30 includes paddle contact areas 46, 48 which are sized and shaped to match the size and shape of the paddles 12 (FIG. 1) on the leadframe 10. A spacing of the paddle contact areas 46, 48 matches a pitch "P" of the leadframe 10. The paddle contact areas 46, 48 are recessed from a top surface of the heat block 30. In addition, the heat block 30 includes vacuum ports 86, 88 for connection to a vacuum source. The vacuum ports 86, 88 are adapted to apply a vacuum to the paddles 12 and hold the dice 24 against the paddle contact areas 46, 48 of the heat block 30 during the wire bonding process.

In order to provide a wire bonding apparatus suitable for practicing the method of the invention, the clamp and heat block of a conventional automated wire bonding apparatus, such as those previously identified, can be constructed or modified to the configurations shown in FIGS. 4-7. This will allow two semiconductor dice 24A, 24B to be wire bonded with a single index of the leadframe 10.

In addition, with such an existing wire bonding apparatus, the movement of the wire bonding tool 34 of an automated wire bonding apparatus can be modified to accommodate wire bonding of multiple dice with a single index of a leadframe through the wire bonding apparatus. Although the invention has been described for wire bonding two dice at once, it is to be understood that a clamp and heat block can be constructed to accommodate more than two semiconductor dice (e.g. 3, 4, 5). If the leadframe strip 10 is moved from left to right, the wire bonding tool 34 will bond the semiconductor die 24 furthest to the right first, then move left, locate reference points on the next die and bond, then continue to the left until all remaining dice are bonded.

Thus the invention provides a simple yet unobvious method and apparatus for wire bonding multiple semiconductor dice with a single index of a leadframe. Using the method and apparatus of the invention, the throughput and speed of conventional automatic wire bonding apparatus can be significantly improved (e.g. 6-30%). By way of example, approximately 500 dice/hour can be wire bonded using the method and apparatus of the invention. The method and apparatus of the invention are suitable for use with most types of semiconductor packages but are particularly suited for use with DIP, ZIP, SOJ, TSOP, PLCC, SOIC, PQFP, or IDF type leadframes and packages.

Although the invention has been described in terms of a preferred embodiment, it is intended that alternate embodiments of the inventive concepts expressed herein be included in the scope of the following claims.

What is claimed is:

1. In semiconductor manufacture a method of wire bonding semiconductor dice attached to a leadframe strip comprising:
    providing a wire bonding apparatus having a heat block for heating the dice and leadframe strip, a clamp having multiple bond site windows spaced apart to match the spacing of the dice on the leadframe strip and a bonding tool for wire bonding;
    indexing the semiconductor leadframe strip to a precise location within the wire bonding apparatus;
    clamping multiple semiconductor dice attached to the leadframe strip between the heat block and clamp of the wire bonding apparatus;
    wire bonding bond pads on a first die to lead fingers of the leadframe strip using the bonding tool of the wire bonding apparatus placed through a first bond site window; and
    moving the bonding tool to successively wire bond each die clamped between the clamp and heat block with a single index of the leadframe.

2. The method as recited in claim 1 and wherein two dice are clamped and successively wire bonded.

3. The method as recited in claim 1 and further comprising retaining multiple dice in contact with the heat block using multiple vacuum ports formed in the heat block.

4. The method as recited in claim 1 and wherein the semiconductor dice and leadframe are suitable for forming DIP, ZIP, SOJ, TSOP, PLCC, SOIC, PQFP, or IDF type semiconductor packages.

5. In semiconductor manufacture, a method of wire bonding bond pads on semiconductor dice with lead fingers of a semiconductor leadframe comprising;
 attaching multiple semiconductor dice to mounting paddles of the leadframe;
 providing a wire bonding apparatus having a heat block for heating the dice and a clamp for clamping the dice for wire bonding by a bond tool, with the heat block and clamp adapted to simultaneously clamp and heat multiple dice;
 indexing the leadframe to a precise location for clamping multiple semiconductor dice between the clamp and heat block for wire bonding; and
 moving the bonding tool to successively wire bond each die clamped between the clamp and heat block with a single index of the leadframe.

6. The method as recited in claim 5 and wherein the heat block and clamp are adapted to wire bond two semiconductor dice with a single index of the leadframe.

7. The method as recited in claim 5 and wherein the semiconductor dice are either DIP, ZIP, SOJ, TSOP, PLCC, SOIC, PQFP, or IDF type dice.

8. The method as recited in claim 5 and wherein the heat block includes multiple die paddle contact areas for contacting multiple die paddles and heating multiple dice.

9. The method as recited in claim 8 and wherein the heat block includes multiple vacuum ports for maintaining the die paddles in contact with the die paddle contact areas.

10. The method as recited in claim 5 and wherein the leadframe is moved from left to right during indexing and the bond tool wire bonds a die furthest to the right first and then moves to the left to wire bond an adjacent die.

11. A method for wire bonding bond pads formed on a semiconductor die to lead fingers of a semiconductor leadframe, comprising;
 attaching multiple semiconductor dice to mounting paddles of the leadframe;
 providing a wire bonding apparatus having a clamp for clamping two semiconductor dice contained on the leadframe to a heat block for heating the dice and leadframe;
 indexing the leadframe to position two adjacent dice for clamping between the clamp and the heat block;
 clamping the two adjacent dice between the clamp and the heat block;
 wire bonding a first clamped die using a bonding tool placed through a first bond site window of the clamp;
 moving the bonding tool to a second clamped die;
 wire bonding the second clamped die using the bonding tool placed through a second bond site window of the clamp; and
 indexing the leadframe to position a next two adjacent dice for clamping between the clamp and heat block and for wire bonding by the bond tool.

12. The method as recited in claim 11 and wherein the heat block includes two die paddle contact areas for contacting the die paddles and two vacuum ports for maintaining the die paddles in contact with the heat block.

13. The method as recited in claim 12 and wherein the dice are selected from the group consisting of DIP, ZIP, SOJ, TSOP, PLCC, SOIC, PQFP, or IDF type dice.

14. The method as recited in claim 13 and wherein the spacing of the bond site windows matches a spacing of the semiconductor dice on the leadframe.

15. The method as recited in claim 14 and wherein the leadframe is moved to the right and a die furthest to the right is wire bonded first.

* * * * *